United States Patent [19]
Fujioka et al.

[11] Patent Number: 5,356,686
[45] Date of Patent: Oct. 18, 1994

[54] X-RAY MASK STRUCTURE

[75] Inventors: Hidehiko Fujioka, Yamato; Takeshi Miyachi, Zama; Yasuaki Fukuda, Hadano; Yuji Chiba, Isehara; Nobutoshi Mizusawa, Yamato; Takao Kariya, Hino; Shunichi Uzawa, Tokyo, all of Japan

[73] Assignee: Canon Kabushiki Kaisha, Tokyo, Japan

[21] Appl. No.: 182,513

[22] Filed: Jan. 14, 1994

Related U.S. Application Data

[63] Continuation of Ser. No. 681,738, Apr. 8, 1991, abandoned.

[30] Foreign Application Priority Data

Apr. 9, 1990 [JP] Japan ................. 2-092017

[51] Int. Cl.$^5$ ................. G03F 9/00; G21K 5/00
[52] U.S. Cl. ................. 428/65; 428/172; 428/201; 430/5; 378/35
[58] Field of Search ............ 428/65, 66, 172, 201; 378/35, 34; 430/5

[56] References Cited

U.S. PATENT DOCUMENTS

| | | | |
|---|---|---|---|
| 4,804,600 | 2/1989 | Kato et al. | 430/5 |
| 5,012,500 | 4/1991 | Watanabe et al. | 378/35 |
| 5,048,066 | 9/1991 | Fukuda | 378/34 |

FOREIGN PATENT DOCUMENTS 0338749 10/1989 European Pat. Off. .
3524196 2/1986 Fed. Rep. of Germany .

OTHER PUBLICATIONS

Suzuki, et al., "High Flatness Mask for Step and Repeat X-Ray Lithography" Journ. of Vacuum Science & Technology B4 Jan.-Feb. 1986, No. 1, pp. 221-225.
Patent Abstracts of Japan, Kokai No. 62-054919, vol. 11, No. 244, Aug. 1987.
Shimkunas, "Advances in X-Ray Mask Technology," Solid State Technology, Sep. 1984, pp. 192 through 199.
Strohm, et al., "Stress Compensated Si-Membrane Masks for X-Ray Lithography with Synchrotron Radiation," 7th European Conference on Electrotechnics Eurocon 86, Session A. I.: Advanced Technologies and Materials (Part 1), Apr. 21, 1986, pp. 30 through 35.

Primary Examiner—Alexander S. Thomas
Attorney, Agent, or Firm—Fitzpatrick, Cella, Harper & Scinto

[57] ABSTRACT

An X-ray mask structure includes a mask substrate having a pattern; a supporting frame for carrying and supporting the mask substrate; and an adhesive material for fixing the mask substrate to the supporting frame; wherein a stress releasing groove is formed in at least one of the mask substrate and the supporting frame.

6 Claims, 3 Drawing Sheets

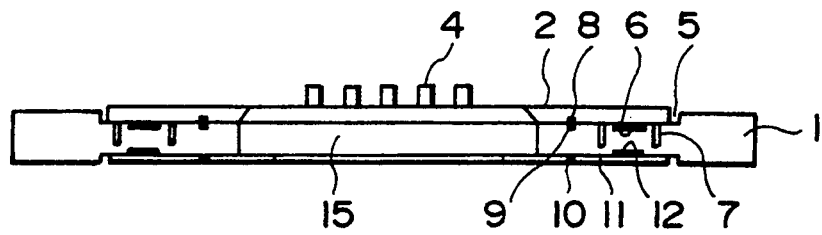
F I G. 7
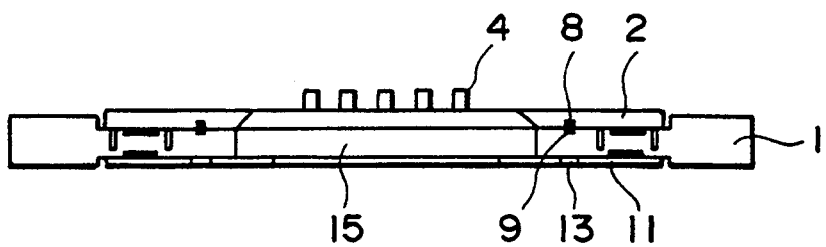
F I G. 8

X-RAY MASK STRUCTURE

This application is a continuation of application Ser. No. 07/681,738 filed Apr. 8, 1991, now abandoned.

FIELD OF THE INVENTION AND RELATED ART

This invention relates to an X-ray mask structure usable in an X-ray exposure apparatus for manufacture of semiconductor devices.

FIG. 1 shows an X-ray mask structure of a known type. Denoted at 1 is a supporting frame, denoted at 2 is a mask substrate, denoted at 3 is an adhesive agent and denoted at 4 is a mask pattern. The mask substrate 2 is placed on the supporting frame 1, and the adhesive agent 3 is applied to the whole periphery of the mask substrate, whereby it is held fixed. The supporting frame 1 has a ring-like shape having an opening 15 formed at its center. The mask pattern 4 is formed of an X-ray absorptive material such as Au, for example, and it is formed on a thin film of a few microns thickness, made of an inorganic material such as SiN or SiC, for example. Also, the mask substrate is formed of an inorganic material such as SiN or SiC, for example. The thin film can be formed by back-etching the mask substrate. The supporting frame 1 is provided by a Ti plate having a thickness of about 0.5–3 mm.

FIG. 2 shows another X-ray mask structure of a known type. In this example, a recess 5 is formed in a supporting frame 1 and, in this recess 5, a mask substrate 2 is held fixed by using an adhesive agent layer 6.

In the X-ray mask structures as described above, there is a difference in coefficient of thermal expansion between the mask substrate and the supporting frame due to a difference in material of them. Thus, a temperature change causes a thermal stress in the X-ray mask structure, resulting in strain or distortion of the mask pattern. Further, possible contraction of the adhesive agent when the same is set causes a stress in the X-ray mask structure, also resulting in strain or distortion of the mask pattern.

Particularly, in a case when an adhesive agent is applied to the whole periphery of a mask substrate, such as in the example of FIG. 1, nonuniformness in thickness of the adhesive agent causes a variation in the quantity of contraction of the adhesive agent when it is set. Thus, by the contraction, an additional stress is applied which results in an enlarged pattern distortion. In a case when an adhesive agent layer is provided as in the example of FIG. 2, there is a disadvantage that, when the adhesive agent contracts, the flatness of the mask pattern bearing surface is degraded considerably.

SUMMARY OF THE INVENTION

It is accordingly a primary object of the present invention to provide an improved X-ray mask structure by which the effect of a thermal stress or a stress due to contraction of an adhesive agent, can be reduced.

In accordance with an aspect of the present invention, to achieve this object, an X-ray mask having a mask pattern formed thereon includes an X-ray mask substrate on which the mask pattern is formed and a supporting frame for carrying and supporting the mask substrate, wherein the mask substrate is fixed to the supporting frame by means of an adhesive agent and wherein at least one of the mask substrate and the supporting frame is formed with a groove effective to release a stress in the mask structure.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 7 is a sectional view of an X-ray mask structure according to a third embodiment of the present invention.

FIG. 8 is a sectional view of an X-ray mask structure according to a fourth embodiment of the present invention.

DESCRIPTION OF THE PREFERRED EMBODIMENTS

Figure 1:
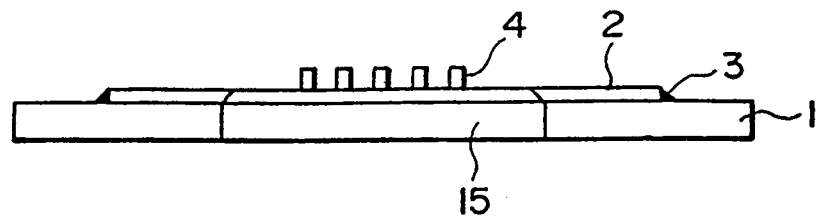
FIG. 1 is a sectional view of an X-ray mask structure of a known type.
Figure 2:
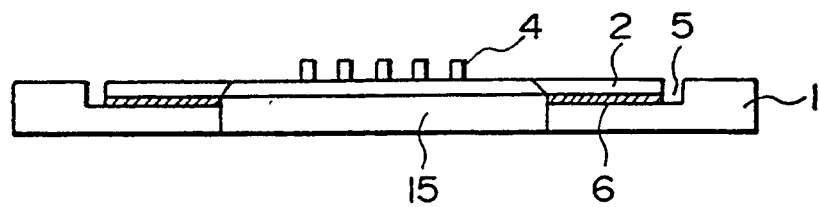
FIG. 2 is a sectional view of another X-ray mask structure of a known type.
Figure 3:
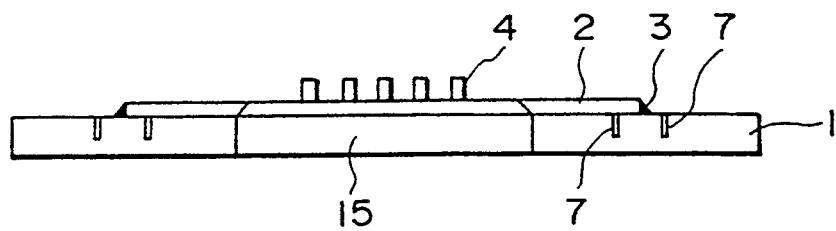
FIG. 3 is a sectional view of an X-ray mask structure according to a first embodiment of the present invention.
Figure 5:
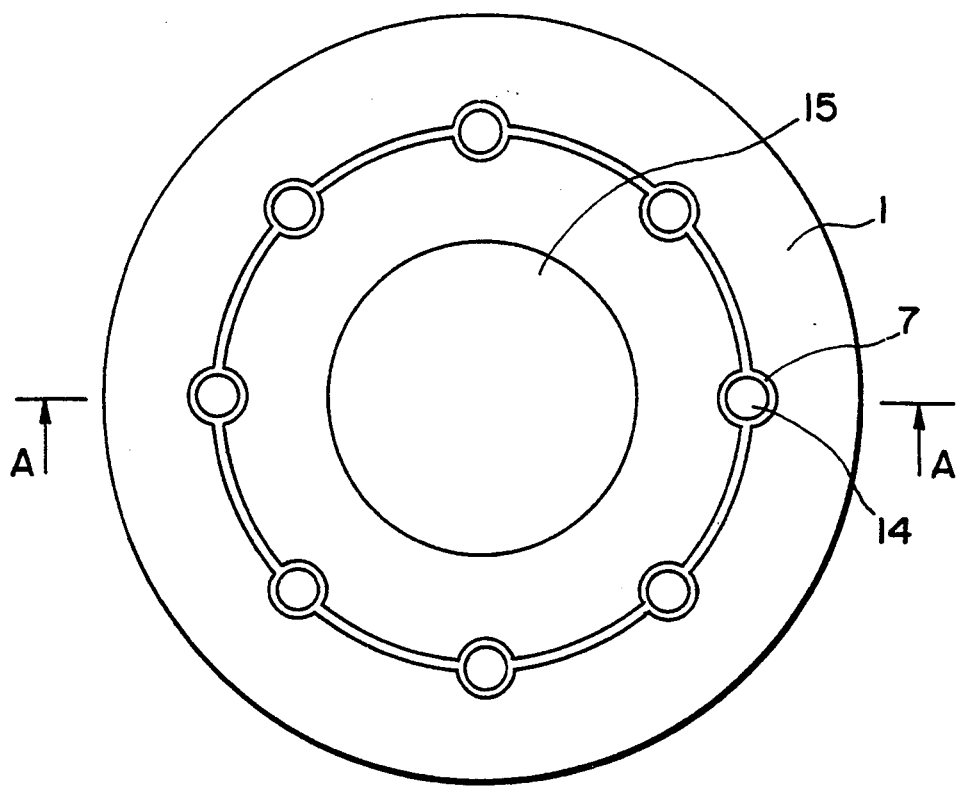
FIG. 5 is a top plan view of a supporting frame of the FIG. 3 embodiment.

FIG. 3 shows a first embodiment of the present invention. Like numerals as those of FIG. 1 are assigned to similar or corresponding elements, and explanation thereof is omitted here. Mask substrate 2 and supporting frame 1 are fixed to each other by means of an adhesive agent 3. In a portion of the supporting frame adjacent the adhesive agent material 3, a slit-like stress releasing groove 7 is formed. Such a stress releasing groove may be formed by using an electric discharging technique, for example. FIG. 5 is a top plan view of the supporting frame 1. FIG. 3 corresponds to the section taken on a line A—A in FIG. 5. As illustrated, the stress releasing groove 7 has a ring-like shape and, at eight points along the ring, adhesive agent applying portions 14 are defined. As seen in FIG. 5, the surface of each adhesive agent applying portion 14 is divided from the surface of the surrounding portion of the supporting frame 1 by the provision of the stress releasing groove 7. Therefore, each adhesive agent applying portion 14 can be deformed relatively easily.

Figure 6:
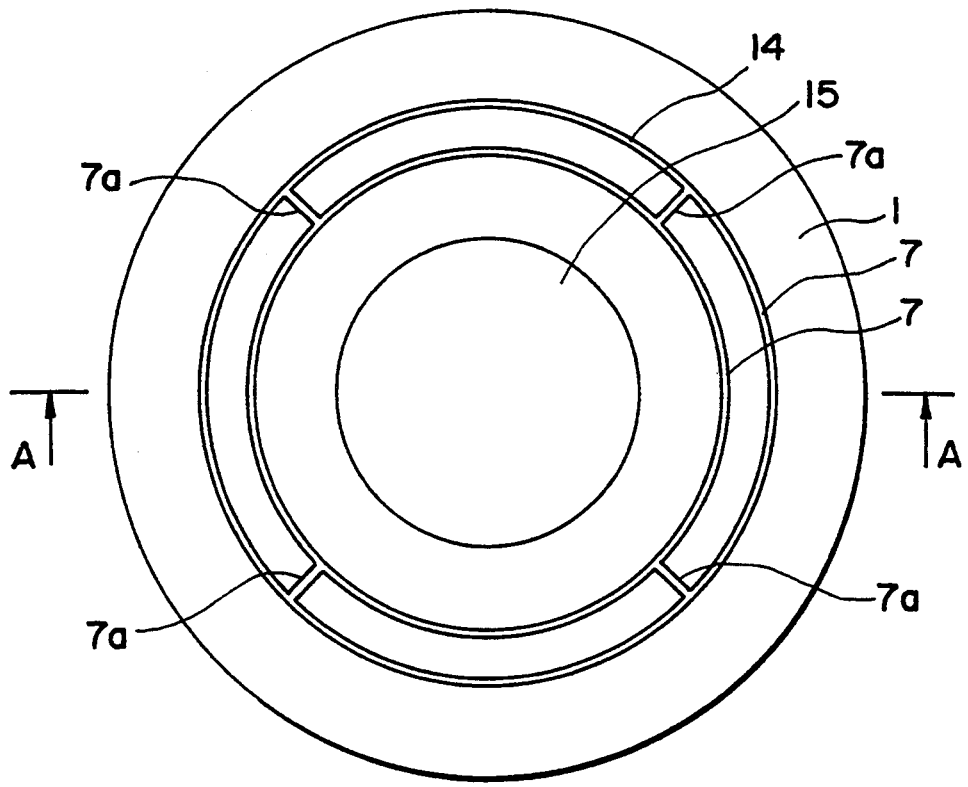
FIG. 6 is a top plan view of a supporting frame, in a modified form of the FIG. 3 embodiment.

FIG. 6 is a top plan view showing another example of stress releasing groove 7. In this example, two ring-like grooves 7 are formed in continuous form, wherein at four sites the two ring-like grooves 7 are connected with each other by means of connection grooves 7a. In this example, an adhesive agent is applied to the peripheral portion of the mask substrate, particularly at adhesive agent applying portions 14 as illustrated.

Figure 4:
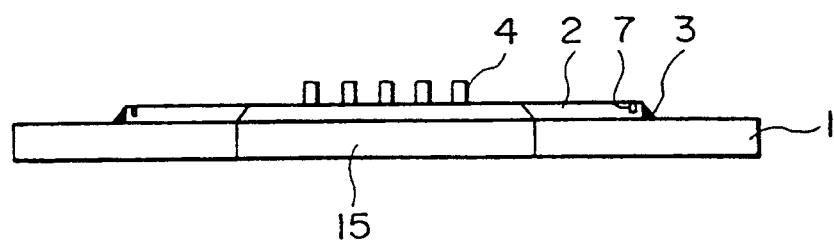
FIG. 4 is a sectional view of an X-ray mask structure according to a second embodiment of the present invention.

FIG. 4 shows a second embodiment of the present invention. In this embodiment, a stress releasing groove 7 is formed in a mask substrate 2. The remaining portion of this embodiment is essentially the same as the FIG. 3 embodiment, with respect to structure and operation.

FIG. 7 shows a third embodiment of the present invention. In this embodiment, a recess 5 is formed in a supporting frame 1 and, in this recess 5, a mask substrate 2 is fixed by using an adhesive agent layer 6. Stress releasing grooves 7 are formed in the supporting frame 1, at the opposite sides of the adhesive agent layer 6, as illustrated. The mask substrate 2 has alignment marks 8 formed thereon which are to be aligned with alignment marks 9, provided on the supporting frame 1, for the mutual positioning of the mask substrate 2 and the supporting frame 1. Also, to the bottom face of the supporting frame 1, a viewangle controlling plate 11 is fixed by means of an adhesive agent layer 12. The viewangle controlling plate 11 also has alignment marks 10 formed thereon which are to be aligned with the marks 9 of the supporting frame 1, for the mutual positioning of the supporting frame 1 and the viewangle controlling plate 11. In place of providing the alignment marks 10 of the viewangle controlling plate 11, throughbores 13 may be formed in the plate as shown in FIG. 8.

In accordance with the present invention, as described hereinbefore, a slit-like groove or grooves are formed adjacent to an adhesive agent material for adhering a mask substrate and a supporting frame to each other. Therefore, undesirable distortion or strain of the mask substrate and/or the supporting frame due to a thermal stress or a stress resulting from contraction of the adhesive agent when it is set, can be absorbed or released. It is therefore possible to attain high-precision and high-reliability pattern exposure transfer.

While the invention has been described with reference to the structures disclosed herein, it is not confined to the details set forth and this application is intended to cover such modifications or changes as may come within the purposes of the improvements or the scope of the following claims.

What is claimed is:

1. An X-ray mask structure, comprising:
    a mask substrate having a pattern;
    a supporting frame carrying and supporting said mask substrate;
    a plurality of fixing means provided at different positions, each of said fixing means fixing said mask substrate to said supporting frame through an adhesive material; and
    stress releasing groove means provided in at least one of said mask substrate and said supporting frame, wherein said groove means is so disposed as to be free from receiving any portion of the adhesive material, and each of said fixing means is substantially surrounded by a corresponding portion of said groove means to substantially isolate each of said fixing means.

2. An X-ray mask structure according to claim 1, wherein said stress releasing groove means absorbs strain of said mask substrate or said supporting frame due to thermal stress or stress resulting from contraction of said adhesive material.

3. An X-ray mask structure according to claim 1, wherein said stress releasing groove means divides a portion of the surface of said supporting frame to which said adhesive material is applied, from a portion of said supporting frame surface to which said adhesive material is not applied.

4. An X-ray mask structure according to claim 1, wherein said supporting frame has a ring-like shape and wherein said stress releasing groove means is formed in a ring-like shape, concentric with the ring-like shape of said supporting frame.

5. An X-ray mask for manufacturing a semiconductor device, comprising:
    a mask substrate having a circuit pattern;
    a supporting frame carrying and supporting said mask substrate;
    a plurality of fixing means provided at different positions, each of said fixing means fixing said mask substrate to said supporting frame; and
    stress releasing groove means provided in at least one of said mask substrate and said supporting frame, wherein said stress releasing groove means is so disposed as to be free from receiving any portion of the adhesive material, and each of said fixing means is substantially surrounded by a corresponding portion of said groove means to substantially isolate each of said fixing means.

6. An X-ray mask structure, comprising:
    a mask substrate having a pattern;
    a supporting frame supporting said mask substrate;
    fixing means fixing said mask substrate to said supporting frame through an adhesive material; and
    stress releasing groove means provided in at least one of said mask substrate and said supporting frame, wherein said groove means is so disposed as to be free from receiving any portion of the adhesive material, and said groove means is defined in a substantially ring-like shape and is disposed radially outwardly of the adhesive material with respect to the center of said mask substrate.

* * * * *